United States Patent [19]

Drimer et al.

[11] Patent Number: 5,338,424
[45] Date of Patent: Aug. 16, 1994

[54] MASKS FOR APPLYING DOTS ON SEMICONDUCTOR WAFERS

[75] Inventors: Gideon Drimer, Ramot; Arie Glazer, Mevasseret Zion, both of Israel

[73] Assignee: Persys Technology Ltd., Jerusalem, Israel

[21] Appl. No.: 998,135

[22] Filed: Dec. 29, 1992

[30] Foreign Application Priority Data

Jun. 5, 1992 [IL] Israel .................................. 102.120

[51] Int. Cl.$^5$ .............................................. C23C 15/00
[52] U.S. Cl. ............................. 204/298.11; 204/298.12; 430/5
[58] Field of Search ........... 430/5; 204/298.11, 298.12

[56] References Cited

U.S. PATENT DOCUMENTS

| | | | |
|---|---|---|---|
| 4,485,000 | 11/1984 | Kawaguchi et al. | 204/298.11 |
| 4,704,306 | 11/1987 | Nakamura | 204/298.11 |
| 4,830,723 | 5/1989 | Galvagni et al. | 204/298.11 |
| 4,988,424 | 1/1991 | Woodward et al. | 204/298.11 |
| 5,154,797 | 10/1992 | Blomquist et al. | 204/298.11 |
| 5,223,108 | 6/1993 | Hurwitt | 204/298.11 |

*Primary Examiner*—Asok Pal
*Attorney, Agent, or Firm*—Pollock, VandeSande and Priddy

[57] ABSTRACT

A mask and an assembly utilizable in the production of a multiplicity of capacitors on selected regions of a semiconductor wafer includes a shaped, thin sheet of material having spaced-apart holes made therein and at least one recess formed adjacent each of at least two opposite edges thereof, the recess being configured to be engaged by a substantially matching portion of a clamp releasably affixing the mask onto the wafer.

5 Claims, 1 Drawing Sheet

MASKS FOR APPLYING DOTS ON SEMICONDUCTOR WAFERS

BACKGROUND OF THE INVENTION

The present invention relates to a dot mask, an assembly and a method for facilitating equipment quality control for semiconductor wafer production. More specifically, the present invention is concerned with the provision of means and a method for forming MOS capacitors on semiconductor wafers during their production, without interrupting the manufacturing process thereof.

Metal dot masks are used in the semiconductor industry to form round metal dots over an oxide to produce MOS capacitors. MOS capacitors produced in this way are for the purpose of measuring capacitance vs. voltage (CV) and capacitance vs. time (CT) parameters. The data obtained from these measurements are indicative monitors for the quality of the semiconductor production equipment, i.e., contamination in furnaces or wet stations.

From the reliability point of view of manufactured IC and similar devices, each fabrication area should run CV and CT measurements on a weekly basis. At present, the method for carrying out such measurements is to attach a hollowed mask to the wafer and to manually place the assembled mask and wafer in the sputtering chamber.

Since the modern sputtering tools use load lock chambers and different additional sputtering chambers on the way to the AlSi target chamber, it became difficult to manually insert the mask and the wafer in the desired chamber. This difficulty lead to the need to use additional metal sputtering equipment in the fabrications, only for CV/CT monitor wafers.

It is therefore a broad object of the present invention to overcome the above-described difficulties in the measurement of CV and CT parameters during the manufacture of semiconductor wafers and to provide means whereby the mask can be temporarily affixed to the wafer while moving through the sputtering chambers.

SUMMARY OF THE INVENTION

In accordance with the present invention there is provided a disposable mask utilizable in the production of a multiplicity of capacitors on selected regions of a semiconductor wafer, comprising a shaped, thin sheet of material having spaced-apart holes made therein and at least one recess formed adjacent at least two opposite edges thereof, said recess being configured to be engaged by a substantially matching portion of a clamp releasably affixing the mask onto the wafer.

The invention further provides a thin assembly utilizable in the production of a multiplicity of capacitors on selected regions of a semiconductor wafer for controlling the quality thereof, comprising a shaped, thin sheet of material having spaced-apart holes made therein, in combination with at least two clamps, wherein said mask and said clamps are provided with interengagement means for releasably fastening said mask onto a surface of said wafer.

In accordance with another aspect of the invention, there is provided a method for controlling the quality of a semi-conductor wafer during the fabrication thereof, comprising providing a semiconductor wafer, a thin, perforated mask and at least two clamps, placing said perforated mask on a surface said wafer, clamping substantially opposite edge portions of said mask onto the wafer by means of said clamps to form a wafer and mask assembly, continuously moving said assembly through sputtering chambers, while forming MOS capacitors on the wafer by sputtering metallic material over the mask so as to cause said material to enter through the perforations and adhere to the surface of the wafer, and removing the mask from the wafer.

BRIEF DESCRIPTION OF THE DRAWINGS

The invention will now be described in connection with certain preferred embodiments with reference to the following illustrative figures so that it may be more fully understood.

With specific reference now to the figures in detail, it is stressed that the particulars shown are by way of example and for purposes of illustrative discussion of the preferred embodiments of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms the invention may be embodied in practice.

DESCRIPTION OF THE PREFERRED EMBODIMENTS

Figure 4:
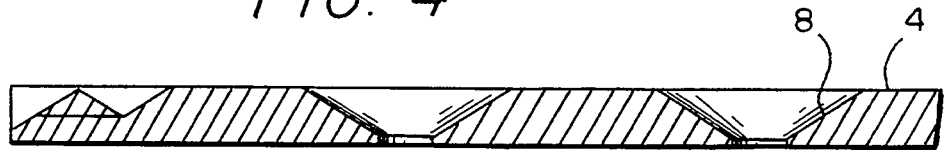
FIG. 4 is a cross-sectional view, drawn to a larger scale, of a mask according to the present invention.

Referring to the Figures, there is seen a semiconductor wafer 2 and a metal dot mask 4 affixed onto the wafer 2 by means of clamps 6. The mask 4 is preferably made from a thin strip of metallic or non-metallic material, such as aluminum, stainless steel, quartz, SiC, etc. Geometrical or non-geometrical shapes of the masks, other than the shape of a strip, can also be used. The mask 4 is provided with holes 8, the number and distribution of which can vary. As seen to better advantage also in FIG. 4, the holes 8 are conical and, optionally, for providing an improved engagement with the clamps 6, grooves 10 extending at least partly across the width of the strip, are formed adjacent to the edges thereof.

Figure 3:
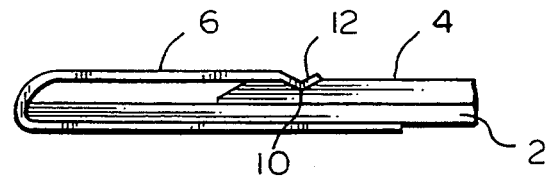
FIG. 3 is a side view, drawn to a larger scale, of the flexible clamp mounted on the mask edge encircles in FIG. 2.

The clamp 6 (FIG. 3) is made of any suitable flexible material and advantageously has the general configuration of a hairpin, namely, two substantially parallely extending limbs interconnected by flexible means. One of the limbs is provided with a bend 12 at its free end. The bend 12 is configured so as to, at least partly, fit the configuration of the groove 10 made in the masks, thereby effecting a more positive engagement between the clamp 4 and the mask and, in turn, between the mask 4 and the wafer 2.

Figure 1:
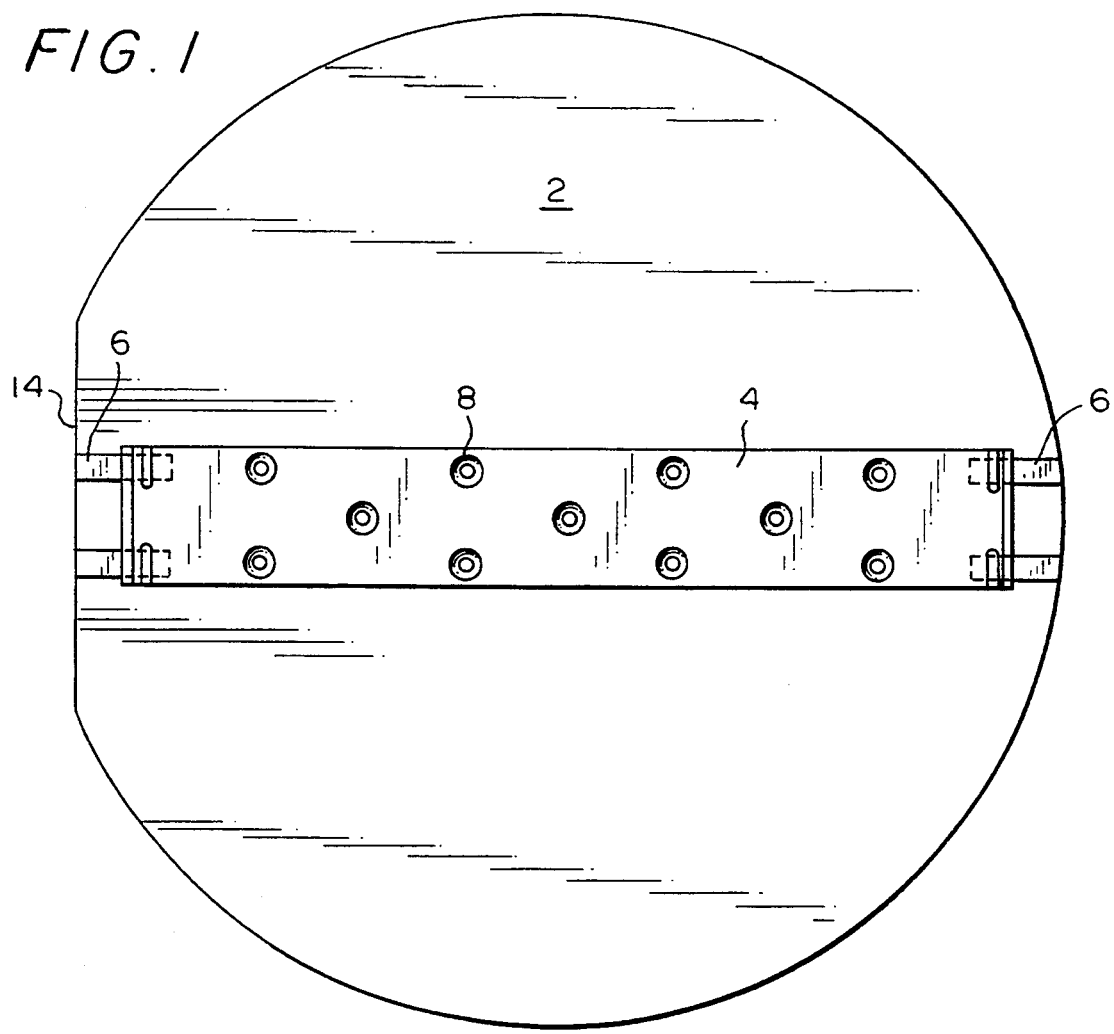
FIG. 1 is a top view of a metal dot mask assembled on a wafer by means of flexible clamps in accordance with the present invention.
Figure 2:
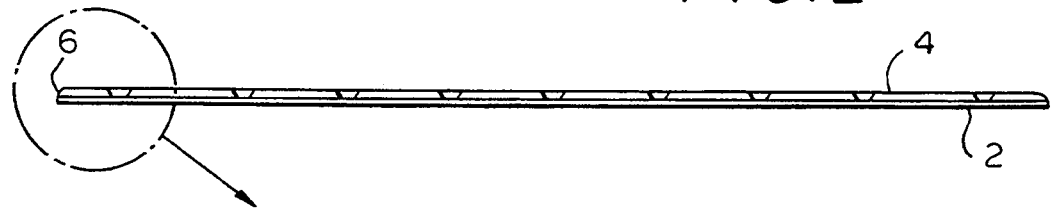
FIG. 2 is a side and cross-sectional view of the mask and the wafer of FIG. 1.

The mask 4 of any suitable size may be attached to the wafer 2 by means of clamps 6 in a disposition substantially perpendicular to the non-circular planar edge 14 of the wafer 2, as shown in FIG. 1, or in any other disposition relative to the edge 14, e.g., parallel thereto. As shown in FIG. 2 the clamped thin mask 4,6 does not appreciably add to the thickness of the wafer 2 and thus, this manner of attaching a mask to a wafer facilitates the loading of a thin assembled masked wafer into a standard slot of a plastic boat, for a fully automated wafer transfer to the sputter chambers.

The method in which the mask 4 is attached to a wafer 2, the shape of the holes 8 in the mask and the flexibility of the clamps 6, provide a mask which can be moved easily by the loading system through the sputtering chambers. The mask can also be placed in different positions with respect to the wafer during sputtering, i.e., vertically, horizontally, downwardly or upwardly. Upon the termination of the sputtering process, the mask can easily be removed from the wafer. In view of the production of the mask from a thin, inexpensive strip of material it may be disposed of after a single use.

It will be evident to those skilled in the art that the invention is not limited to the details of the foregoing illustrative embodiments and that the present invention may be embodied in other specific forms without departing from the spirit or essential attribute thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

We claim:

1. A mask utilizable in the production of a multiplicity of capacitors on selected regions of a semiconductor wafer, comprising a shaped, thin sheet of material having spaced-apart holes made therein and at least one recess formed adjacent each of at least two opposite edges thereof, said recesses being respectively configured to be engaged by substantially matching portions of clamps releasably affixing the mask onto the wafer in a thin assembly that can be inserted into and removed from a sputtering machine without interruption of production.

2. The mask as claimed in claim 1, wherein said sheet of material is made of metal.

3. The mask as claimed in claim 1, wherein said holes are conical.

4. The mask as claimed in claim 1, wherein said sheet is in the form of a strip.

5. The mask as claimed in claim 1, wherein said recess is in the form of a slot.

* * * * *